United States Patent [19]
Bae

[11] Patent Number: 5,811,223
[45] Date of Patent: Sep. 22, 1998

[54] METHOD FOR INSPECTING PROCESS DEFECTS OCCURRING IN SEMICONDUCTOR DEVICES

[75] Inventor: Sang Man Bae, Ichon, Rep. of Korea

[73] Assignee: Hyundai Electronics Industries Co., Ltd., Ichon, Rep. of Korea

[21] Appl. No.: 725,177

[22] Filed: Oct. 3, 1996

[30] Foreign Application Priority Data

Apr. 10, 1995 [KR] Rep. of Korea ............... 95-33881

[51] Int. Cl.$^6$ ............................................. G03F 7/20
[52] U.S. Cl. ..................... 430/312; 430/316; 430/394
[58] Field of Search ............................ 430/312, 316, 430/329, 394, 396

[56] References Cited

U.S. PATENT DOCUMENTS

| | | | |
|---|---|---|---|
| 4,586,822 | 5/1986 | Tanimoto | 356/394 |
| 5,472,813 | 12/1995 | Nakagawa | 430/5 |
| 5,506,080 | 4/1996 | Adair | 430/5 |
| 5,561,011 | 10/1996 | Miyazaki | 430/7 |
| 5,667,940 | 9/1997 | Hsue | 430/312 |

*Primary Examiner*—Kathleen Duda
*Attorney, Agent, or Firm*—Reid & Priest LLP

[57] ABSTRACT

A method for inspecting process defects occurring in a semiconductor device, which involves forming positive and negative-type etchable layer patterns on a semiconductor wafer by use of positive photoresist film patterns and negative photoresist film patterns respectively formed on adjacent dies, detecting the difference in dimension between corresponding patterns on adjacent dies in a die-to-die comparison manner by a defect inspection device, and compensating for the light exposure mask used in the pattern formation based on the result of the detection, thereby reducing the difference in critical dimension of patterns in each field of the light exposure mask due to the proximity effect, the topology of the wafer, the difference in thickness of thin films on the wafer, and the aberration of the lens as used. The positive-type etchable layer patterns are arranged on every second die of the semiconductor wafer whereas the negative-type etchable layer patterns are arranged on dies of the semiconductor wafer respectively adjacent to the dies on which the positive-type etchable layer patterns are arranged.

7 Claims, 2 Drawing Sheets

METHOD FOR INSPECTING PROCESS DEFECTS OCCURRING IN SEMICONDUCTOR DEVICES

BACKGROUND OF THE INVENTION

1. Field of the Invention

The present invention relates to a method for inspecting process defects occurring in a semiconductor device, and more particularly to a method for inspecting process defects occurring in a semiconductor device, which can form patterns by use of positive photoresist film patterns and negative photoresist film patterns respectively formed on adjacent dies, based on a phenomenon that even when a light exposure process is conducted using photo shield film patterns having the same dimension to pattern a photoresist film, patterns of the photoresist film have different dimensions at different positions in a region (namely, a field region) where the photoresist film is exposed to light upon conducting the light exposure process once.

2. Description of the Prior Art

Generally, the lithography process used in the fabrication of semiconductor devices involves a proximity effect in that even when a light exposure mask provided with photo shield film patterns having the same dimension is used, patterns formed on a wafer have different dimensions due to a variation in diffraction rate of light passing through the light exposure mask depending on the density of photo shield film patterns of the light exposure mask and an interference between light beams respectively passing through adjacent patterns of the light exposure mask. In addition to such a proximity effect, patterns formed in the same field region have a difference in dimension due to the topology of a substrate on which those patterns are formed or the aberration of the lens of a stepper as used. When such a difference in dimension of patterns increases, the process margin is reduced. In severe cases, a short circuit or line breakage may occur.

In order to form patterns having a desired dimension taking into consideration such undesirable effects, patterns are formed on a substrate using a light exposure mask provided with photo shield film patterns having the same dimension are first formed, and a difference in critical dimension (CD) of those patterns resulting from the undesirable effects is then detected by a CD-SEM device. The detected value is fed back to form a light exposure mask provided with photo shield film patterns having different dimensions. When such a light exposure mask is used, it is possible to prevent a reduction in process margin and a degradation in quality of products resulting from the proximity effect, the topology of the substrate, the difference in thickness in thin films, and the aberration of the lens.

FIGS. 1A, 1B, and 1C are views respectively illustrating a conventional method for inspecting process defects occurring in a semiconductor device.

In accordance with the illustrated conventional method, an etchable layer 2 is first coated over a semiconductor wafer 1. A positive or negative photoresist film is then formed over the etchable layer 2. Thereafter, the photoresist film is exposed to light using a light exposure mask having photo shield film patterns with the same dimension, thereby forming photoresist film patterns respectively arranged on the dies of the semiconductor wafer 1. Using the photoresist film patterns as an etch mask, the etchable layer 2 is then etched, thereby forming patterns thereof. In this case, the patterns of the etchable layer 2 have different pattern dimensions in the same field due to the difference in the intensity of light upon an inclined light exposure, the proximity effect, the topology of the wafer, the difference in thickness of thin films on the wafer, and the aberration of the lens as used. This is shown in FIG. 1A.

Thereafter, the semiconductor wafer 1 provided with the patterns of the etchable layer 2 is loaded in a defect inspection device 5 which, in turn, compares dimensions $a_1$ ... $a_n$ of the patterns with one another, thereby calculating a difference in critical dimension.

In this case, the pattern comparison is conducted for the patterns $a_1$ and $a_n$ respectively arranged on the central and edge portions of each die 3 because the difference in dimension between adjacent patterns, for example, $a_1$ and $a_2$ is too small to be measured. The patterns $a_1$ and $a_n$ respectively arranged on the central and edge portions of each die have a relatively large difference in dimension as compared to adjacent patterns.

In the case of highly integrated memory devices such as DRAM's of 64 Mega-grade or greater or ASIC devices having lines of various dimensions, however, it is impractical to compensate for a difference in critical dimension in the above-mentioned manner because those devices have a very large number of patterns requiring a complex and huge calculation. Moreover, the inspection has a difficulty because the difference in critical dimension is very small, for example, less than 0.2 $\mu$m.

For this reason, formation of patterns is conducted while ignoring the above-mentioned proximity effect or compensating for particular pattern portions in accordance with conventional methods. In accordance with such conventional methods, however, process defects occur in various portions of a semiconductor device as finally obtained because the calculation and compensation for a difference in critical dimension is not conducted for all patterns of the device, but conducted for a part of patterns. Such a problem becomes more severe when the semiconductor device has a highly integrated structure or has patterns with various dimensions. As a result, a degradation in process yield occurs. Moreover, a lot of time is taken for the compensation, thereby increasing the manufacturing cost.

SUMMARY OF THE INVENTION

Therefore, an object of the invention is to solve the above-mentioned problems and to provide a method for inspecting process defects occurring in a semiconductor device, which involves forming patterns by use of positive photoresist film patterns and negative photoresist film patterns respectively formed on adjacent dies so as to obtain a doubly increased difference in dimension among the formed patterns, detecting the difference in dimension between corresponding patterns on adjacent dies in a die-to-die comparison manner by a defect inspection device, and compensating for the light exposure mask used in the pattern formation based on the result of the detection, thereby reducing the difference in critical dimension of patterns in each field of the light exposure mask due to the proximity effect, the topology of the wafer, the difference in thickness of thin films on the wafer, and the aberration of the lens as used.

In accordance with the present invention, this object is accomplished through a method for inspecting process defects occurring in a semiconductor device, comprising the steps of: forming an etchable layer over a semiconductor wafer provided with a plurality of dies; forming a positive photoresist film over the first etchable layer, and patterning the positive photoresist film by use of a light exposure mask in such a manner that the positive photoresist film is left on every second die of the semiconductor wafer, thereby forming patterns of the positive photoresist film; etching the etchable layer on the dies covered with the positive photoresist film patterns by use of the positive photoresist film patterns as a mask, thereby forming positive-type etchable layer patterns, and removing the positive photoresist film patterns; forming a negative photoresist film over the entire upper surface of the resulting structure obtained after the removal of the positive photoresist film patterns, and patterning the negative photoresist film by use of the same light exposure mask as that used for the positive photoresist film in such a manner that the negative photoresist film is left on the dies not covered with the positive-type etchable layer patterns; etching the etchable layer on the dies covered with the negative photoresist film patterns by use of the negative photoresist film patterns as a mask thereby forming negative-type etchable layer patterns, and removing the negative photoresist film patterns; and loading the semiconductor wafer formed with the positive and negative-type etchable layer patterns in a defect inspection device, and inspecting a difference in dimension between the positive and negative-type etchable layer patterns in a die-to-die comparison manner.

In accordance with this method, the dimensions of patterns are compared in a die-to-die comparison manner by use of the defect inspection device, thereby quantitatively measure the difference in critical dimension of the patterns at different positions in each field region of the light exposure mask. Based on the result of the measurement, a variation in pattern dimension caused by the proximity effect, the topology of the wafer, the difference in thickness of thin films on the wafer, and the aberration of the lens is derived. The derived value is fed back to correct an error occurring in the photo shield film patterns of the light exposure mask.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
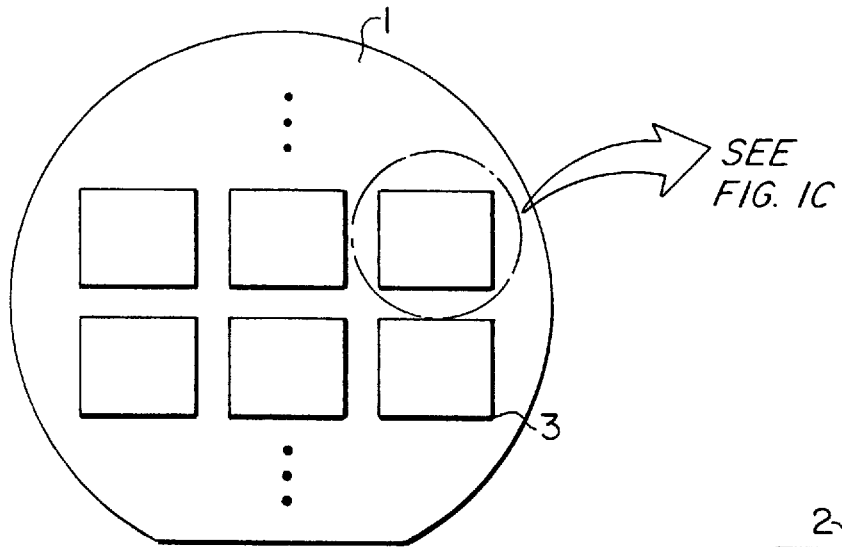
FIGS. 1A, 1B, and 1C are views respectively explaining a conventional method for inspecting process defects occurring in a semiconductor device.
Figure 1C:
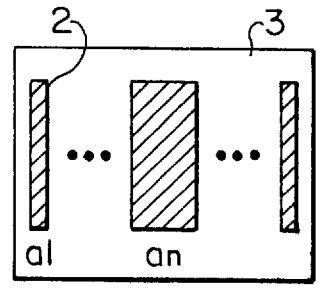
Figure 1B:
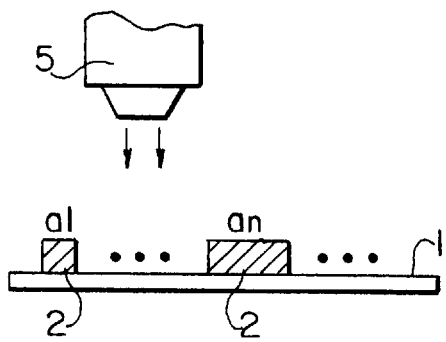
Figure 2:
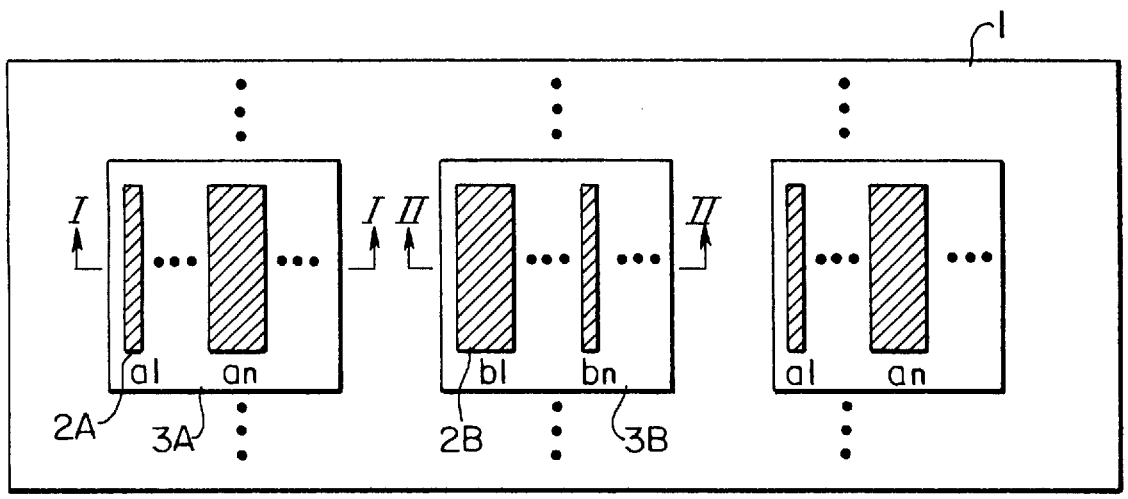
FIG. 2 is a schematic view explaining a method for inspecting process defects occurring in a semiconductor device in accordance with the present invention.
Figure 3:
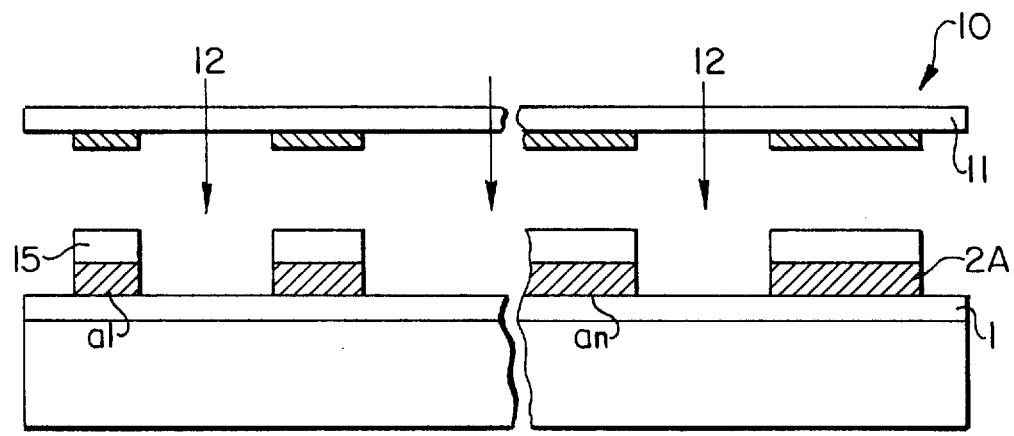
FIG. 3 is a cross-sectional view taken along the line I—I of FIG. 2, showing positive-type etchable layer patterns formed using positive photoresist film patterns of FIG. 2.
Figure 4:
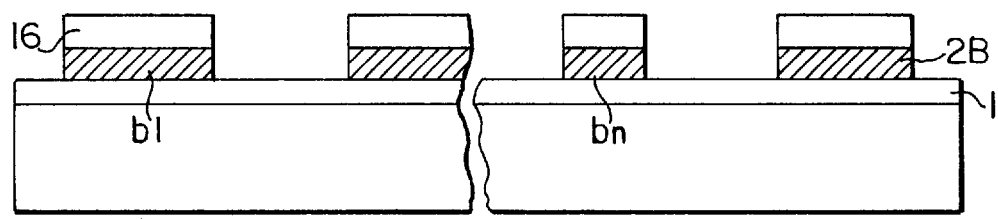
FIG. 4 is a cross-sectional view taken along the line II—II of FIG. 2, showing negative-type etchable layer patterns formed using negative photoresist film patterns of FIG. 2.

FIGS. 2 to 4 are views explaining a method for inspecting process defects occurring in a semiconductor device in accordance with the present invention, respectively. This defect inspection method will be described in conjunction with FIGS. 2 to 4.

In accordance with this method, a light exposure mask 10 is first fabricated, as shown in FIG. 3. The light exposure mask 10 includes a transparent substrate 11 and a plurality of photo shield film patterns 12 formed in the form of lines/spaces on the transparent substrate 11. The photo shield film patterns 12 have a width of about 0.2 to 1.0 μm and a length of 20 mm. In this case, the size of each field region is about 20 mm$^2$.

Meanwhile, an etchable layer 2 made of an etchable material such as an oxide, nitride or other metal is coated over a semiconductor wafer 1 having a desired structure. A positive photoresist film 15 is then coated over the etchable layer 2 to a thickness of 0.1 to 0.5 μm. The positive photoresist film 15 is then selectively exposed to light using the above-mentioned light exposure mask 10, thereby forming patterns of the positive photoresist film 15 in such a manner that the patterns are arranged on every second die of the semiconductor wafer 1. The dies, on which the patterns of the positive photoresist film 15 are disposed, are denoted by the reference numerals 3A in FIG. 2.

Although the light exposure mask 10 has the photo shield film patterns 12 having the same dimension, the patterns of the positive photoresist film 15 have different dimensions at different positions thereof respectively corresponding to different portions of the field region of the light exposure mask 10, for example, the central and edge portions C and E of the field region due to the proximity effect, the topology of the wafer, the difference in thickness of thin films on the wafer, and the aberration of the lens as used.

Thereafter, portions of the etchable layer 2 not covered with the patterns of the positive photoresist film 15 are removed using those patterns as a mask, thereby forming positive-type etchable layer patterns 2A. The remaining positive photoresist film 15 is then completely removed.

Over the entire upper surface of the resulting structure, a negative photoresist film 16 is then coated to a thickness of about 0.1 to 1.5 μm. The negative photoresist film 16 is then selectively exposed to light using the light exposure mask 10 shown in FIG. 3 for its patterning. The light exposure for the negative photoresist film 16 is carried out so as to form patterns each arranged on a die disposed between adjacent dies 3A. After developing the negative photoresist film 16, patterns of the negative photoresist film 16 are obtained which have a larger dimension at the central portion C of the field region and a smaller dimension at the edge portion E of the field region. In FIG. 2, the dies, on which the patterns of the negative photoresist film 16 are disposed, are denoted by the reference numeral 3B.

Thereafter, portions of the etchable layer 2 not covered with the patterns of the negative photoresist film 16 are removed in accordance with an appropriate method such as a full-surface anisotropic etch method. As a result, negative-type etchable layer patterns 2B are formed.

For the resulting structure having the above-mentioned structure, an inspection of process defects is then conducted using a defect inspection device. For this inspection, the semiconductor wafer 1 is loaded in the defect inspection. Thereafter, dimensions $a_1 \ldots a_n$ of the positive-type etchable layer patterns 2A and dimensions $b_1 \ldots b_n$ of the negative-type etchable layer patterns 2B are measured in a die-to-die comparison manner. When the patterns 2A and 2B compared with each other have a difference in dimension larger than a predetermined value of, for example, 0.01 μm to 0.2 μm, the defect inspection device detects occurrence of process defects. In this case, correction of process defects is conducted.

Where the etchable layer 2 is made of a material exhibiting a high reflection factor, noise is generated during the inspection of process defects. As a result, it is difficult to perform the inspection. In order to reduce such a noise, an anti-reflection film made of TiN or WSi may be formed over the etchable layer 2 to a thickness of 100 to 10,000 Å. In this case, the anti-reflection film is appropriately patterned.

Meanwhile, although not shown, the defect inspection device utilizing the principle of optics includes a light source emitting light beams. These light beams are fed along a desired optical path and then irradiated onto the semiconductor wafer 1. A signal sensor unit senses the light beams reflecting from the semiconductor wafer 1 in the form of pattern images.

For each pattern image of the wafer sent to the signal sensor unit, its lightness/darkness or color index is then derived based on the reflection index of the pattern image. The data about color index as obtained in the above-mentioned manner are converted into corresponding electrical signals having values ranging from 0 to 255. Among the pattern images, those having a lightness/darkness difference beyond a predetermined value, namely, a threshold value, are associated with patterns requiring a compensation, respectively.

As mentioned above, the etchable layer patterns are formed using the light exposure mask having lines/spaces with a certain pitch. However, it is also possible to use a contact hole mask. In accordance with the present invention, a difference in dimension between the largest and smallest patterns is derived. This correction value is fed back to form corrected photo shield film patterns of the light exposure mask. Using this light exposure mask, it is possible to compensate for a difference in critical dimension occurring in all pattern portions in the field region due to the proximity effect, the topology of the wafer, the difference in thickness of thin films on the wafer, and the aberration of the lens as used.

As apparent from the above description, the present invention provides a method for inspecting process defects occurring in a semiconductor device, which utilizes the phenomenon that even when photo shield film patterns are used, patterns of an etchable layer have different dimensions at different positions in the field region. In accordance with the present invention, positive and negative photoresist film patterns are formed on dies of a semiconductor wafer in an alternating manner, respectively. The difference in dimension between corresponding positive and negative photoresist film patterns is compared to each other in a die-to-die comparison manner by a defect inspection device, thereby quantitatively measuring the difference in critical dimension of the patterns at different positions in the field region. Based on the result of the measurement, a variation in pattern dimension caused by the proximity effect is derived. The derived value is fed back to correct an error occurring in the photo shield film patterns of the light exposure mask. For all pattern portions in each field region, accordingly, the difference in critical dimension caused by the proximity effect, the topology of the wafer, the difference in thickness of thin films on the wafer, and the aberration of the lens can be corrected only by conducting the above-mentioned inspection once. Therefore, it is possible to reduce the time taken for the inspection of process defects. This results in an improvement in process yield and operation reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for inspecting process defects occurring in a semiconductor device, comprising;

forming an etchable layer over a semiconductor wafer provided with a plurality of dies;

coating a positive photoresist film over the etchable layer, and patterning the positive photoresist film by use of a light exposure mask in such a manner that the positive photoresist film is left on a first set of dies constituting every second die of the semiconductor wafer, thereby forming patterns of the positive photoresist film;

etching the etchable layer by use of the positive photoresist film patterns as a mask, thereby forming first patterns, and removing the positive photoresist film patterns;

coating a negative photoresist film over an entire upper surface of a resulting structure, and patterning the negative photoresist film by use of the same light exposure mask as that used for the positive photoresist film in such a manner that the negative photoresist film is left on a second set of dies that is distinct from the first set of dies, the second set of dies not being covered with the first patterns;

etching the etchable layer on the dies covered with the negative photoresist film patterns by use of the negative photoresist film patterns as a mask, thereby forming second patterns, and removing the negative photoresist film patterns; and loading the semiconductor wafer formed with the first and second patterns in a defect inspection device, and inspecting a difference in dimension between the first and second patterns in a comparison of dies between the first set of dies and the second set of dies, so as to inspect for the process defects.

2. The method in accordance with claim 1, wherein:

the light exposure mask has line/space patterns or contact patterns as its photo shield film patterns.

3. The method in accordance with claim 2, wherein:

when the light exposure mask has line/space patterns as its photo shield film patterns, it has a pattern width of 0.2 to 1.0 $\mu$m and a pattern length of 20 mm or less.

4. The method in accordance with claim 1, wherein:

the light exposure mask has a field size of 20 $mm_2$.

5. The method in accordance with claim 1, wherein:

when the first and second patterns compared with each other have a difference in dimension larger than a predetermined value of 0.01 $\mu$m to 0.2 $\mu$m, the defect inspection device detects occurrence of process defects and corrects the process defects.

6. The method in accordance with claim 1, further comprising:

forming an additional anti-reflection film over the etchable layer, and patterning the anti-reflection film.

7. The method in accordance with claim 6, wherein:

the anti-reflection film is made of TiN or WSi and has a thickness of 100 to 10,000 Å.

\* \* \* \* \*